(12) United States Patent
Figuet et al.

(10) Patent No.: US 7,772,127 B2
(45) Date of Patent: Aug. 10, 2010

(54) SEMICONDUCTOR HETEROSTRUCTURE AND METHOD FOR FORMING SAME

(75) Inventors: Christophe Figuet, Crolles (FR); Mark Kennard, Crolles (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 0 days.

(21) Appl. No.: 11/267,494

(22) Filed: Nov. 3, 2005

(65) Prior Publication Data
US 2007/0051975 A1    Mar. 8, 2007

(30) Foreign Application Priority Data
Sep. 7, 2005    (EP) .................. 05291841

(51) Int. Cl.
H01L 21/31    (2006.01)
H01L 21/469    (2006.01)

(52) U.S. Cl. .................. 438/763; 438/458; 438/783; 257/E21.103; 257/E21.116; 257/E21.124

(58) Field of Classification Search .................. 257/352, 257/183, E21.093, E21.103, E21.116, E21.124; 438/752, 761, 94, 478, 763, 783, 936, 938, 438/FOR. 179, FOR. 286, 455, 458, FOR. 487
See application file for complete search history.

(56) References Cited

U.S. PATENT DOCUMENTS

| | | | | |
|---|---|---|---|---|
| 5,442,205 A | | 8/1995 | Brasen et al. ............... 257/191 |
| 5,744,401 A | * | 4/1998 | Shirai et al. ................. 438/693 |
| 6,995,078 B2 | * | 2/2006 | Liu et al. ..................... 438/483 |
| 6,995,430 B2 | * | 2/2006 | Langdo et al. ............... 257/352 |
| 7,387,953 B2 | * | 6/2008 | Figuet ......................... 438/478 |
| 2001/0020700 A1 | * | 9/2001 | Inoue et al. .................. 257/20 |
| 2003/0153161 A1 | * | 8/2003 | Chu et al. .................... 438/455 |
| 2003/0203600 A1 | | 10/2003 | Chu et al. .................... 438/479 |
| 2003/0215990 A1 | | 11/2003 | Fitzgerald et al. ........... 438/172 |
| 2004/0075105 A1 | * | 4/2004 | Leitz et al. ................... 257/190 |
| 2005/0023646 A1 | * | 2/2005 | Lee et al. ..................... 257/616 |
| 2005/0179028 A1 | | 8/2005 | Chen et al. ................... 257/19 |

(Continued)

FOREIGN PATENT DOCUMENTS

EP    1 439 570 A1    7/2004

(Continued)

OTHER PUBLICATIONS

S.M. Sze(Physics of semiconductor devices,second edition,1981).*

(Continued)

*Primary Examiner*—Matthew Smith
*Assistant Examiner*—Quovaunda Jefferson
(74) *Attorney, Agent, or Firm*—Winston & Strawn LLP

(57) ABSTRACT

The invention relates to a method for forming a semiconductor heterostructure by providing a substrate with a first in-plane lattice parameter $a_1$, providing a buffer layer with a second in-plane lattice parameter $a_2$ and providing a top layer over the buffer layer. In order to improve the surface roughness of the semiconductor heterostructure, an additional layer is provided in between the buffer layer and the top layer, wherein the additional layer has a third in-plane lattice parameter $a_3$ which is in between the first and second lattice parameters.

18 Claims, 2 Drawing Sheets

U.S. PATENT DOCUMENTS

2005/0274978 A1* 12/2005 Antoniadis et al. .......... 257/192
2006/0151787 A1   7/2006 Chen et al. .................... 257/65

FOREIGN PATENT DOCUMENTS

EP     1 447 839 A1   8/2004
WO     WO 2005078786   *  8/2005

OTHER PUBLICATIONS

M. L. Lee et al., "Strained Si, SiGe, and Ge channels for high-mobility metal-oxide-semiconductor filed-effect transistors", Journal of Applied Physics, vol. 97, 011101-27 (2005).

* cited by examiner

SEMICONDUCTOR HETEROSTRUCTURE AND METHOD FOR FORMING SAME

BACKGROUND ART

The invention relates to a method for forming a semiconductor heterostructure comprising providing a substrate with a first in-plane lattice parameter $a_1$, providing a buffer layer with a second in-plane lattice parameter $a_2$, and providing a top layer over the buffer layer. The invention furthermore relates to the corresponding semiconductor heterostructure and to a semiconductor device that includes such semiconductor heterostructure.

Semiconductor heterostructures like this are known from U.S. Pat. No. 5,442,205, which discloses semiconductor heterostructure devices with strained semiconductor layers. The known heterostructure includes a strained epitaxial layer of silicon or germanium which is located over a silicon substrate with a spatially graded $Ge_xSi_{1-x}$ epitaxial layer, which in turn is overlaid by an ungraded capping layer $Ge_{x0}Si_{1-x0}$, intervening between the silicon substrate and the strained layer. The graded layer and the capping layer therein play the role of the buffer layer and the strained layer the role of the top layer. Such heterostructures can serve, for instance, as a foundation for surface emitting LEDs or MOS FETs.

The spatially graded $Ge_xSi_{1-x}$ layer of the buffer layer is used to adapt the lattice parameter between the underlying substrate and the deposited relaxed material, while trying to minimize the density of defects. Usually the additional capping layer of SiGe with constant Ge concentration corresponding to the concentration obtained at the top of the graded layer is provided as a relaxed layer to improve the crystalline quality of the structure.

The structure obtained usually has a surface morphology that is not suitable for further use. US patent application 2003/0215990, which is preoccupied by preventing interdiffusion of dopants in semiconductor heterostructures, proposes a planarization step, in particular a Chemical Mechanical Polishing (CMP) step, before growing any further layer(s). Here it is the role of CMP to provide a polished smooth surface, which is typically of about 2 Å. Following CMP, the substrate needs to be further treated to prepare the subsequent layer deposition. Such treatments include treating the surface using a HF solution and furthermore a bake to remove any oxide. Then, the 2003/0215990 application proposes epitaxial deposition of further layers like silicon germanium or strained silicon layers.

It appears, however, that the achieved surface properties for the semiconductor heterostructures are not completely acceptable when applying the above described prior art processes. Indeed, due to the heat treatment or bake that is applied prior to the deposition of the further layers, a roughening of the silicon germanium surface occurs. During the subsequent growth of, e.g., a strained silicon layer, the surface roughness tends to diminish again the final roughness, but nevertheless stays considerably higher than the roughness of the graded GeSi layer surface or of the capping layer, if present, after completing the CMP process. As the thickness of the strained silicon layer cannot exceed the critical thickness, beyond which defects would nucleate within the layer or at the interface of the strained and the underlying layers, this roughness can lead to defects. When the overall thickness of the strained silicon layer is relatively thin, no additional CMP can be carried out for flattening out or smoothing the surface of the strained silicon layer to the desired values. In addition to the increasing the thickness to allow partial improvement in surface roughness, US2003/0215990 also proposes to control the temperature at which the layers are grown after planarization. Despite these improvements, final surface roughness values only on the order of 5 Å can be achieved.

Furthermore, the buried interface between the top layer, e.g., a strained layer, and the underlying layer have even a higher roughness, due to the heat treating and bake after CMP of the buffer layer. This buried interface, however, becomes a top free surface when the strained layer is transferred onto another substrate, such as a handle substrate to create a strained silicon on insulator type semiconductor heterostructure. This can, for example, be achieved using the well known SMART-CUT® layer cleaving process. Again also here, no additional CMP can be carried out for flattening out the surface due to its relatively thin thickness.

Surface roughness is critical for substrate quality, because a rough surface on the heterostructure will in turn lead to a rough final structure for the electronic devices that are to be developed thereon. A rough surface is also detrimental for the electrical behavior of the formed devices. It is therefore necessary to improve surface smoothness on such substrates to avoid or at lease minimize these problems.

SUMMARY OF THE INVENTION

The invention now provide a method for forming a heterostructure and a corresponding semiconductor heterostructure which has significantly better surface roughness properties and/or significantly better buried interface roughness properties than the prior art. In particular, these advantages are achieved in a method for forming a semiconductor heterostructure that includes a substrate, a buffer layer and a top layer, wherein the method reduces surface roughness of the semiconductor heterostructure by providing the substrate with at least a surface layer having a first in-plane lattice parameter; providing the buffer layer with a second in-plane lattice parameter and providing the buffer layer upon the surface layer of the substrate; and providing an additional layer in between the buffer layer and the top layer, with the additional layer having a third in-plane lattice parameter which has a value in between those of the first and second lattice parameters.

The method is preferably used for fabricating a strained layer on insulator structure for use in preparing a semiconductor device, wherein the semiconductor heterostructure described herein 1 is used as a donor substrate and from which a thin layer is cleaved therefrom and transferred to a received substrate, such as by a SMART-CUT® layer transfer process.

BRIEF DESCRIPTION OF THE DRAWING FIGURES

Advantageous embodiments of the invention will be described in the following with respect to the figures.

DETAILED DESCRIPTION OF THE PREFERRED EMBODIMENTS

Figure 1:
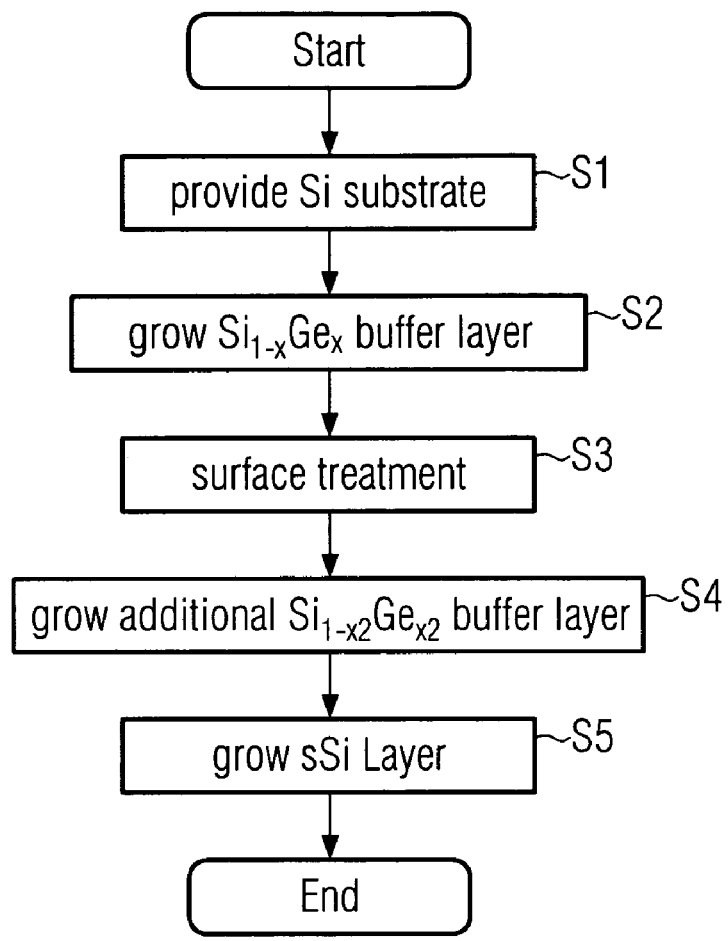
FIG. 1 illustrates a first embodiment of the inventive method for forming a semiconductor heterostructure.

It is the surprising finding of this invention that by providing an additional layer between the buffer layer and the top layer, wherein the value of the in-plane lattice parameter of the additional layer is chosen such that it is in between the value of the first and second lattice parameter, the surface roughness of the additional layer is reduced compared to the surface roughness of the underlying buffer layer. As a consequence the surface roughness of the heterostructure is reduced in comparison to the state of the art heterostructures. This is due to the fact that the top layer grows on a already smoother surface. In addition, in the case the top layer gets transferred onto a handle substrate and the buried interface between the additional and the top layer actually becomes the new free surface, also an improved surface roughness will be observed, as the surface of the additional layer is smoother than the surface of the underlying buffer layer. Advantageously, the additional layer is provided after the planarization and heat treating or baking steps.

In this context the term "in-plane lattice parameter" corresponds to a lattice parameter of the various layers in a direction essentially parallel to the interfaces between the various layers and to lattice parameters which the layers would show in an relaxed state. It is, in fact, known that the lattice parameter depends on the material used, but also on the nature of the underlying material on which it is deposited. To be able to compare lattice parameter values of different layers in the following, it is always referred to values as if the layers were in a relaxed state, and not in the strained state under heteroepitaxial conditions, which is also known under the terms pseudomorphic or commensurate growth. As an interface may be characterized by two lattice parameters, the above-mentioned condition can either be satisfied for both lattice parameters or for only one. Furthermore like mentioned above, the buffer layer can comprise a plurality of layers, e.g., a composition graded layer with or without a capping layer. In addition, the subsequent layer of the substrate can be with the buffer layer or the additional layer. It should also be noted that the top layer of the heterostructure is not necessarily the final layer, because further layers or strained or relaxed materials can be provided thereon.

According to a preferred embodiment of the invention, the additional layer and/or the top layer can be grown with a growth temperature lower than the growth temperature of the buffer layer. It is another surprising observation that, in addition to the intermediate in plane lattice parameter of the additional layer, a reducing of the growth temperature for the additional and/or the top layer compared to the growth temperature of the buffer layer, the surface roughness of the semiconductor heterostructure is further improved in comparison to what is achieved according to the prior art. Thus by combining the two roughness reducing methods. the overall reduction in surface roughness can be further enhanced.

Advantageously the growth temperature is chosen to be about 50° C. to about 500° C. lower than the growth temperature used for forming the buffer layer. The exact choice of the temperature depends on the precursors used during CVD type deposition of the layers. In this range best results have been achieved for numerous materials.

According to an advantageous embodiment, the thickness of the additional layer can be less than the critical thickness, above which defects occur, in particular less than 1000 Å, more in particular a thickness of about 200 Å to 800 Å, even more in particular of about 600 Å. It should be noted, that the critical thickness depends on the material choice for the additional layer and the underlying layer, but is also a function of deposition temperature. For the above mentioned values, very improved surface roughness values have been obtained. To keep the additional layer thin has the advantage of preventing defects on its surface and furthermore is advantageous with respect to production, as throughput can be kept high.

Advantageously the buffer layer and the additional layer can comprise at least two compounds A and B and have a different composition $A_{1-xa2}B_{xa2}$ and $A_{1-xa3}B_{xa3}$ with respect to each other. For example, the buffer layer can be a gradient layer of a binary material, such that starting from the substrate the lattice parameter increases (or diminishes) towards the interface with the top layer and for the additional layer the composition of the binary material can be chosen such that a step back (or increase) in lattice parameter is observed. In fact, by changing the composition usually the lattice parameters change in turn. By using the same compounds, the buffer layer and the additional layer can be grown under similar process conditions and only the supply of the compounds needs to be adapted to realize the different compositions and thus different lattice parameters.

Preferably the difference in composition $\Delta x = x_{a2} - x_{a3}$ is approximately 0.5% to 8%, in particular 2% to 5%, more in particular 2.5%. For those changes in composition, optimized surface roughness values have been achieved for the surface of the top layer. For $\Delta x$ less than 0.5% the desired flattening effect is not sufficient and for $\Delta x$ larger than 8% the maximum thickness of the additional layer would be limited too much due to a reduced critical thickness.

Preferably the top layer can be a strained layer of a relaxed layer, in particular one of strained silicon (sSi), silicon germanium ($Si_{1-x}Ge_x$), germanium (Ge) and gallium arsenide (GaAs). These materials are playing an important role in modern electronics and therefore with improved semiconductor heterostructures of these materials optimized electronic properties can be achieved. Advantageously the substrate can be silicon and/or the buffer layer can be silicon germanium ($Si_{1-xa2}Ge_{xa2}$). The silicon as a standard material is readily available and allows to keep fabrication costs low and furthermore with respect to silicon germanium the buffer layer deposition process is well established so that high quality graded layers or layers with a stepped composition can be achieved by playing with the supply of the silicon and germanium precursors respectively. According to a preferred embodiment the additional layer can be silicon germanium ($Si_{1-xa3}Ge_{xa3}$). Thus to grow the additional layer one only has to adapt the process already used for the buffer layer to grow the desired layer.

According to a preferred embodiment, starting from a Si substrate, the lattice parameter of the buffer layer increases. The resulting surface roughness after CMP and heat treatment or baking of the buffer layer can be attributed to a surface topology having peaks and valleys, wherein the lattice parameter of the crystalline material tends to be larger on the peak, compared to the nominal lattice parameter, and tends to be smaller in the valleys. By now growing the additional layer with a smaller nominal lattice parameter, the growth speed of the layer in the valleys shall be higher than for the peaks, as a better match of lattice parameters is observed. Thereby leading to the desired surface flattening effect.

Preferably the growth temperature of silicon germanium when used for the top layer and/or the additional layer can be chosen to be:

TABLE 1

| layer material | growth temperature [° C.] |
| --- | --- |
| $Si_{1-x}Ge_x$, $x \in [0, 20]$ | 650–750 |
| $Si_{1-x}Ge_x$, $x \in [20, 40]$ | 600–700 |
| $Si_{1-x}Ge_x$, $x \in [40, 60]$ | 550–650 |
| $Si_{1-x}Ge_x$, $x \in [60, 80]$ | 500–600 |
| $Si_{1-x}Ge_x$, $x \in [80, 90]$ | <600 |
| $Si_{1-x}Ge_x$, $x \in [90, 100]$ | <550 |

For this specific material choice, improved surface roughness values have been observed. Advantageously the growth temperature of strained silicon germanium when used for the top layer can be chosen to be less than 600° C., in particular less than 550° C. to 700° C., or wherein the growth temperature of germanium when used for the top layer is chosen to be less than 500° C. For this specific material choice, improved surface roughness values have been observed.

Preferably the precursor for the additional layer can be selected such that they do not incorporate an halide element. For GeSi, this would lead for instance to a germane and silane or disilane precursor. The presence of an halide in the precursor creates the risk to have crystalline defects revealed, e.g., due to preferential etching at the location of a crystalline defect, which could be present in a GeSi material, and which would lead to an increase in the size of the defect and deteriorate the quality of the layer.

The invention also relates to a semiconductor heterostructure such as that which is produced by the inventive method. As explained above such a semiconductor heterostructure benefits from improved surface roughness values. This semiconductor heterostructure preferably has a surface roughness of the top layer that is less than 1.8 Å RMS, in particular less than 1.5 Å RMS, even more in particular less than 1.3 Å RMS. Such low surface roughness values are advantageous as actually the electrical behavior of devices formed thereon heavily depends on the roughness of the initial substrate.

Furthermore, these semiconductor heterostructures have an interface roughness at the interface between the additional layer and the top layer that less than 2.5 Å RMS, in particular less than 2.0 Å RMS, even more in particular less than 1.8 Å RMS. Depending on the final use of the semiconductor heterostructure, the buried interface between the additional layer and the top layer can become a free surface again and in this case an improved surface roughness is advantageous as in particular electronic properties depend heavily on the surface roughness of such a surface.

According to another embodiment of the invention, the buffer layer and the additional layer can comprise at least two compounds A and B and have a different compositions with respect to each other, such as $A_{1-x_{a2}}B_{x_{a2}}$ and $A_{1-x_{a3}}B_{x_{a3}}$. By changing the composition of the layers, the desired lattice parameters can be easily achieved by changing the growth conditions. Preferably, the difference in composition $\Delta x = x_{a2} - x_{a3}$ is approximately 0.5 to 8%, in particular 2% to 5%, more in particular 2.5%, as previously stated. For these values optimized surface roughness values have been observed. For $\Delta x$ less than 0.5% the desired flattening effect is not sufficient and for $\Delta x$ larger than 8% the maximum thickness of the additional layer would be limited too much due to a reduced critical thickness.

Preferably the thickness of the additional layer and/or the top layer is less than the critical thickness above which defects occur, in particular less than 1000 Å, more in particular of about 200 Å to 800 Å, even more in particular of about 600 Å. To keep the additional layer thin has the advantage of preventing defects on its surface and furthermore is advantageous with respect to production, as throughput can be kept high. Furthermore the creation of dislocations is prevented. It has been observed that the surface roughness tends to become better after the growth of the top layer material, which would actually incite one to grow thicker layers to provide minimal layer roughness. This advantageous effect of the thickness is, however, limited by the critical thickness as in crystalline structures grown on underlying layers with different crystalline parameters, growing stress leads to defects like dislocations, which in turn deteriorate the quality of the substrate.

Preferably the top layer can be one out of strained silicon, silicon germanium and germanium and the substrate can be silicon and the buffer layer can be silicon germanium.

The invention furthermore relates to the use of the semiconductor heterostructure as described above, as a substrate in the fabrication process of the semiconductor devices. With the optimized surface roughness, the electrical behavior of the semiconductor devices fabricated on the semiconductor heterostructure according to the invention will be superior to devices formed on state of the art semiconductor heterostructures.

The invention furthermore relates to the use of a semiconductor heterostructure as described above as a substrate in the fabrication process of a semiconductor device. In addition the semiconductor heterostructure as disclosed above can advantageously used in the fabrication process of a strained layer on insulator wafer, in particular a strained silicon on insulator wafer. With the improved surface roughness of the inventive semiconductor heterostructure electronic devices with improved properties and engineered substrates with improved properties are achievable. In particular substrates comprising strained layers, like strained silicon, become more and more important they are at the basis of faster semiconductor devices.

Preferably the semiconductor heterostructure as disclosed above can be used in a SMART-CUT® type fabrication process, wherein the semiconductor heterostructure is used as a donor substrate. Typically a SMART-CUT® type process comprises the steps of providing a handle substrate, e.g., a silicon wafer, forming a predetermined splitting area in a donor substrate, attaching the donor substrate to the handle substrate and detaching the donor substrate at the predetermined splitting area to thereby transfer a layer of the donor substrate onto the handle substrate to create a compound material wafer. By forming the predetermined splitting area in the additional layer or at the buried interface between additional layer and top layer, the buried interface will become the free surface of the compound material wafer following an etching step, to remove remaining material of the additional layer. As the buried interface has improved surface roughness when using a semiconductor heterostructure according to the invention the final quality of the engineered wafer obtained by the SMART-CUT® process is improved, as far as the final etching step is controlled so that it does not deteriorate the final surface roughness.

The invention also relates to a semiconductor device comprising a semiconductor heterostructure as described above. As mentioned above, the semiconductor device will show superior electrical behavior compared to a similar semiconductor device comprising a state of the art heterostructure substrate.

The invention also relates to a strained silicon on insulator wafer (sSOI) comprising a wafer, in particular a Si wafer, and on one surface thereof a strained Si layer having been transferred onto the wafer from a semiconductor heterostructure as disclosed above, wherein the top layer is a strained silicon layer and wherein the originally buried interface between the strained silicon layer and the additional layer corresponds to the free surface of the sSOI wafer. This sSOI wafer distinguishes itself from the prior art by the fact that its surface roughness qualities are improved with respect to prior art sSOI wafers.

The following embodiments will be described using a silicon substrate, a silicon germanium buffer layer and a strained silicon layer. This does, however, not represent a limitation of the invention to those materials. Indeed, the invention can also be applied to other suitable materials, like strained SiGe, SiGeC, Ge or GaAs, as noted herein.

FIG. 1 is a block diagram illustrating a first embodiment of the inventive method for forming a semiconductor heterostructure. In step $S_1$ a silicon substrate is provided. Silicon substrates are readily available with different sizes and different crystalline surfaces. Then in step $S_2$ a buffer layer of $Si_{1-x}Ge_x$ is grown, preferably epitaxially, on the silicon substrate. The buffer layer can be a graded buffer layer, thus the concentration of the two compounds: silicon and germanium changes over the thickness of the buffer layer. By doing so the lattice parameter in the graded buffer slowly changes. For example, one can start with x=0 at the interface towards the silicon substrate, so that the lattice parameter corresponds to the one of the underlying Si substrate. Then the germanium concentration can grow until approximately 20%, thereby the in-plane lattice parameter becomes larger. It should be noted, however, that the final germanium concentration can be freely chosen, for instance 30% or 40%, and could even reach 100%.

The growth of the buffer layer can be achieved using state of the art techniques, for example chemical vapor deposition in an epitaxial equipment using standard process conditions. Suitable precursor gases for the deposition of silicon germanium include for example $SiH_4$, $Si_3H_8$, $Si_2H_6$, DCS or TCS and $GeH_4$, $GeH_3Cl$, $GeH_2Cl_2$, $GeHCl_3$ or $GeCl_4$ together with $H_2$ as a carrier gas. Depending on the precursor gases and their decomposition temperature the deposition temperature is chosen, as can be seen from Table 2, which represents some possible examples suitable for the growth of $Si_{1-xa2}Ge_{xa2}$ with a germanium content of up to about 20%. The composition gradient is achieved by adapting the amount of the Si and/or Ge precursor. Alternatively the deposition could be carried out by molecular beam epitaxy.

TABLE 2

| Si precursor | Ge precursor | deposition temperature |
| --- | --- | --- |
| $SiH_4$ | $GeH_4$ | 800° C.–900° C. |
| $SiH_2Cl_2$ | $GeH_4$ | 800° C.–950° C. |
| $SiH_2Cl_2$ | $GeCl_4$ | 1000° C.–1100° C. |
| $SiHCl_3$ | $GeCl_4$ | 1050° C.–1150° C. |

Then in step $S_3$ a surface treatment is carried out which comprises chemical mechanical polishing (CMP) to obtain a surface on the $Si_{1-xa2}Ge_{xa2}$ layer having a roughness of about 1.3 Å RMS, obtained for a scan window of 2 μm*2 μm. Then the achieved structure undergoes a bake step, e.g. is emerged in hydrofluoric acid HF and heated in hydrogen $H_2$ for about three minutes in a temperature range of about 800 to 850° C. This step is used to remove oxide from the surface of the buffer layer, but the bake step leads to an increased surface roughness of about 2.6 Å RMS.

Following the surface treatment, in step S4, an additional layer is grown on the buffer layer. This additional layer is grown with a constant composition of the same compounds silicon and germanium, but with a composition $Si_{1-xa3}Ge_{xa3}$ different to the composition of the final layer of the buffer layer. Having the same compounds, essentially the same growth conditions can be chosen, except for the amount of precursor gas provided for each compound. The total thickness of the additional layer and all further layers that are not lattice matched with the buffer layer should be less than the critical thickness, to prevent the nucleation of dislocations or other defects which would occur above this thickness. The value of the critical thickness depends on the difference in Ge concentration between buffer layer and additional layer, and also depends on deposition temperature. Best results have been achieved for thicknesses of less than 1000 Å, in particular for a thickness in a range of about 200 Å to 600 Å, more in particular of about 600 Å for the additional layer. The composition of the second layer is chosen such that the in-plane lattice parameter is smaller than the in-plane lattice parameter of the final layer of the first buffer layer. With the germanium composition of 20% on top of the buffer layer, in this example, suitable percentages for the additional layer are of 12 to 19.5%, in particular 17.5% of germanium. For 40% Ge in the buffer layer, Ge concentration in the additional layer is between 35% and 39.5%.

Then in step S5 a strained silicon (sSi) layer is epitaxially deposited on the additional buffer layer using state of the art layer deposition methods.

Figure 2:
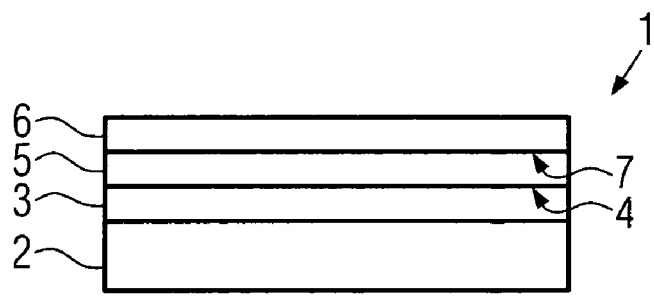
FIG. 2 illustrates a corresponding inventive semiconductor heterostructure.

FIG. 2 illustrates the result obtained after that the inventive process has been carried out as described above. The semiconductor heterostructure 1 according to this embodiment thus comprises a silicon substrate 2 with a first in-plane lattice parameter a1, a graded $Si_{1-xa2}Ge_{xa2}$ buffer layer 3 having a germanium percentage of 0% at the interface with the substrate 2 and having a germanium percentage of about 20% at its upper surface 4. Within the buffer layer 3 the in plane lattice parameter a2 increases as the amount of Ge increases. The graded buffer layer is essentially relaxed. On the graded buffer layer 3 an additional, epitaxial $Si_{1-xa3}Ge_{xa3}$ layer 5 is provided, which as described above has been formed after CMPing and heat treating or baking the buffer layer 3. The additional layer has a germanium percentage that is in a range of about 12 to 19.5%, in particular 17.5%. So that its nominal, thus relaxed, in-plane lattice parameter a3 is less than a2 on top of the buffer layer 3. However, as the thickness is less than the critical thickness the additional layer 5 is strained meaning that its in-plane lattice parameter is larger than the nominal value. Finally on top of the additional layer 5 the strained silicon layer 6 as top layer is present.

For a strained silicon layer 6 with a thickness of about 200 Å, surface roughness values of less than 1.8 Å RMS, in particular less than 1.3 Å RMS, have been achieved with a post-bake roughness of the buffer layer 3 being of the order of about 2.6 Å RMS. Up to now, with the state of the art processes, only surface roughnesses exceeding 1.8 Å RMS have been observed.

It should be noted that already the buried interface 7 between the additional layer 5 and the strained silicon layer 6 has already a roughness of less than 2.5 Å RMS, in particular less than 2.0 Å RMS, even more in particular of less than 1.8 Å RMS. The buried interface roughness is thus improved with respect to interface 4 having a roughness of the order of 2.6 Å after CMP and bake.

The first embodiment of the invention has been explained for a graded buffer layer 3. However, it is also possible to provide a buffer layer having a different composition structure. For example, a capping layer could be provided on the graded layer 3 prior to CMP and bake, or the buffer layer could comprise a stack of bi-layers, in particular three to five bi-layers, wherein one bi-layer has a graded composition and the second bi-layer a constant composition. A buffer layer being composed of a plurality of layers with constant germanium composition but with a growing composition from layer to layer represents a further alternative. In addition, it is also possible to provide one or more further additional layers, also called capping or relaxed layers, in between the additional layer 5 and the final layer 6. For example, another SiGe layer may be deposited onto the additional buffer layer with a different SiGe composition.

Instead of a silicon germanium buffer layer, other compound materials may be used to slowly increase the lattice parameter starting from the silicon substrate towards the desired value.

According to a further variant, a germanium Ge, $Si_{1-y}Ge_y$, or SiGeC layer may be grown as a final layer, instead of the strained silicon layer 6.

A second embodiment of the inventive method for forming a semiconductor heterostructure comprises steps S1 to S3 and S5 of the first embodiment. Their description will not repeated again, but is incorporated herewith by reference. The difference with respect to the first embodiment lies in the fact that during the growth of the additional layer (step S4) a growth temperature is used which is lower than the growth temperature used during formation of the buffer layer 3. The growth temperature for the additional $Si_{1-x}Ge_x$ layer is chosen to be about 50° C. to about 500° C. lower than the growth temperature of the graded buffer layer. During growth of the buffer lower one typically looks for a high deposition temperature to ensure high growth rates but by choosing a lower growth temperature for the additional layer, even though growth speed will lower, it is possible to preferably deposit material in the valleys of the surface of the $Si_{1-x}Ge_x$ buffer layer rather than on the peak. As a consequence a smoothing effect occurs this effect adds to the already advantageous effect of having a smaller in-plane lattice parameter applied in the first embodiment. Thus, a further improved smoothing of the surface of additional layer 5 and thus also of the top layer 6, here the strained Silicon layer, will occur.

Indeed, when the growth temperature is high, the total thermal energy of the arriving atoms is high and the surface energy, which is the energy of the surface on which the atoms are deposited, becomes negligible, so that it cannot have a positive impact on smoothening. If, however, the thermal energy is relatively low, like here, the surface energy can have a positive impact, as by depositing atoms into the valleys, the overall surface becomes smaller and an energy gain is observed. Thus, in this case a smoothing of the surface will occur. If, however, the temperature is too low, the thermal energy will not be sufficient for the arriving atoms to move to the preferred nucleation sites in the valleys to reduce the surface energy.

The semiconductor heterostructure obtained according to the second embodiment corresponds to the one of the first embodiment as shown in FIG. 2, the description of its features is incorporated herewith by reference. Also the additional variants can be applied to the second embodiment. The only difference is that the surface roughness properties are even better both at the buried interface 7 and on the surface of the top layer 6. For a strained silicon layer 6 with a thickness of about 200 Å, surface roughness values of less than 1.15 Å RMS has been achieved with a post-bake roughness of the buffer layer 3 being of the order of about 2.6 Å RMS. Also the buried interface 7 between the additional layer 5 and the strained silicon layer 6 has improved roughness values of less than 1.8 Å RMS, and as low as 1 Å RMS.

The advantageous temperature range actually used depends on the material of the layer, e.g. for a $Si_{1-x}Ge_x$ layer on the Germanium content, the precursor gases used, and the layer thickness. Table 3 illustrates the preferred temperature range for the additional layer 5 as a function of the Germanium percentage in $Si_{1-x}Ge_x$.

TABLE 3

| layer material | typical growth temperature buffer layer 3 [° C.] | growth temperature additional layer 5 [° C.] |
|---|---|---|
| $Si_{1-x}Ge_x$, x∈[0, 20] | 800–900 | 650–750 |
| $Si_{1-x}Ge_x$, x∈[20, 40] | 750–850 | 600–700 |
| $Si_{1-x}Ge_x$, x∈[40, 60] | 700–800 | 550–650 |
| $Si_{1-x}Ge_x$, x∈[60, 80] | 650–750 | 500–600 |
| $Si_{1-x}Ge_x$, x∈[80, 90] | 600–700 | <600 |
| $Si_{1-x}Ge_x$, x∈[90, 100] | 550–650 | <550 |

For CVD layer deposition of the additional layer the precursors have to be chosen such that they have a decomposition temperature which is lower or at least close to the temperature range indicated in table 3 used are chosen. As a consequence it may occur that the growth of the additional layer 5 a different precursor is used or needs to be used than for the buffer layer 3.

FIGS. 3a to 3f illustrate a third embodiment according to the invention, namely a SMART-CUT® type fabrication process using a semiconductor heterostructure according to the first or second embodiment to fabricate a strained layer on insulator wafer, here a strained silicon on insulator wafer (sSOI).

Figure 3A:
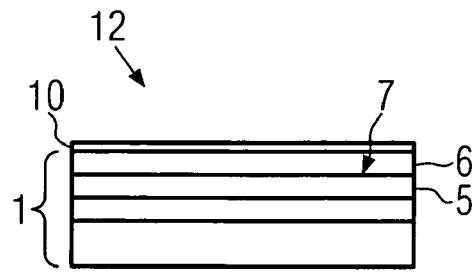
FIGS. 3a to 3f illustrate a SMART-CUT® type process using the semiconductor heterostructure according to the invention.

FIG. 3a illustrate the semiconductor heterostructure 1 comprising the strained silicon layer 6 and the additional layer 5, which has been fabricated according to the first or second embodiment described above. The semiconductor heterostructure is used as an initial donor substrate. On the stained layer 6 an isolating layer 10 is provided. This layer 10 is e.g., achieved by thermally oxidizing the strained layer 6. The heterostructure 1 together with the isolating layer 10 builds up a donor substrate 12.

Figure 3B:

FIG. 3b illustrates a handle substrate 14, typically a standard wafer, e.g., a Si wafer. The surface of the handle substrate can either be with or without the native or a grown isolating layer, e.g. the native $SiO_2$ layer the case of a Si wafer.

Figure 3C:
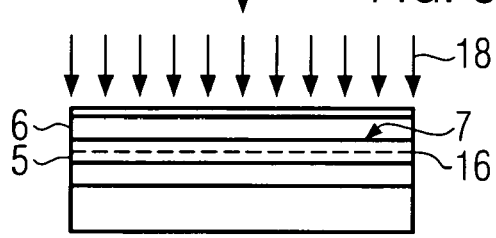

FIG. 3c illustrates the process to create a predetermined splitting area 16 in the initial donor substrate 1. This is achieved by implanting atomic species 18, like for example hydrogen ions or other inert gases, with a predetermined dose and energy. Due to the implantation the predetermined splitting area 16 is created inside the donor substrate 12. The implantation conditions are chosen such that the predetermined splitting area 16 is positioned in the additional layer 5 or close to the buried interface 7 towards the top layer 6.

Figure 3D:
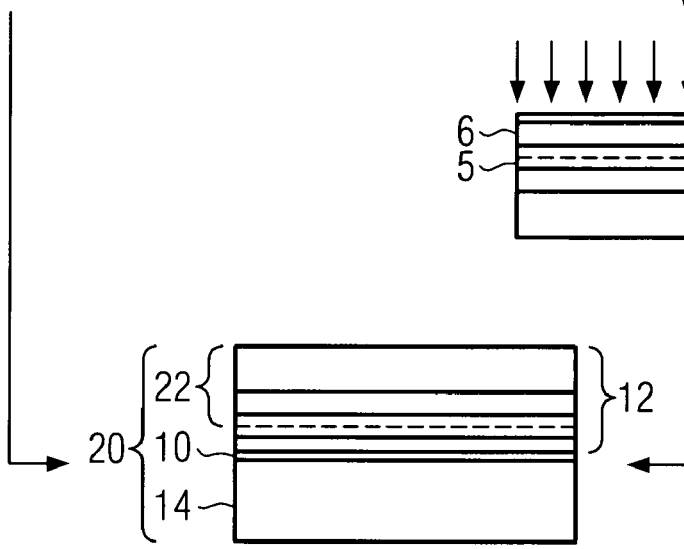

FIG. 3d illustrates the next step in the process which consists in attaching the initial donor substrate 12 to the handle substrate 14 by bonding the free surface of the insulating layer 10 of the donor substrate 12 onto the handle substrate 14 to thereby form a donor-handle compound 20. Prior to bonding eventually a surface preparation step is carried out.

The donor-handle compound 20 is then placed into a furnace (not shown) and heated such that the predetermined splitting area 16 is weakened or fragilized which finally leads to a detachment of the remainder 22 of the donor substrate 12. Instead of providing thermal energy, the fragilization and detachment may also be achieved by providing additional energy in any form, for instance mechanical energy or a combination of thermal and mechanical energy.

Figure 3E:
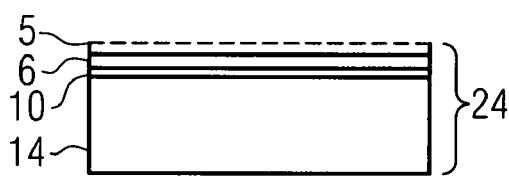

FIG. 3e illustrates the result of the detachment step. A compound material wafer 24 is achieved comprising the insulating layer 10, the top layer 6 and a part of the additional layer 5 in this order on the handle substrate 14.

Figure 3F:
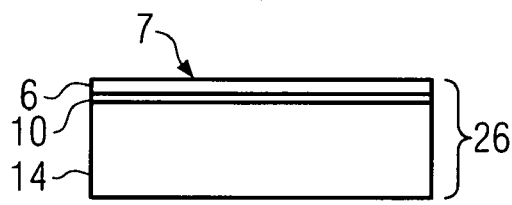

The compound material wafer 24 then undergoes a further surface treatment to remove the remaining part of the additional layer 5. This can for example be achieved by an etching step. As a consequence the buried interface 7 of the original semiconductor heterostructure 1 now becomes the free surface. The final strained silicon on insulator substrate 26 is illustrated in FIG. 3f. It comprises the handle substrate 14, the isolating layer 10 and the top layer 6, thus the strained silicon layer. As due to the provision of the additional layer 5 the buried interface 7, now being the free surface, has superior surface roughness properties, the strained silicon wafer according to this embodiment is improved compared to the prior art. Instead of a strained silicon on insulator wafer also other types of top layers 6 could be transferred including the above mentioned SiGe, Ge or GaAs.

In addition to the sSOI wafer, a SiGe on insulator (SiGeOI) wafer could be produced, for instance by using SiGe as top layer 6, like mentioned above, or by depositing a relaxed layer of SiGe on the top layer 6, thus a layer which is lattice matched with the buffer layer.

The semiconductor heterostructures according to the first and second embodiment as well as the strained layer on insulator wafers according to the third embodiment are advantageously used in semiconductor devices, as improved electrical or optical properties can be achieved with the substrates having improved surface roughness properties.

What is claimed is:

1. A method for reducing surface roughness in a semiconductor heterostructure that includes a substrate, a buffer layer and a top layer, which method comprises:
   providing the substrate with at least a surface layer having a first in-plane lattice parameter that corresponds to the lattice parameter value of the substrate material in a relaxed state;
   providing the buffer layer with a second in-plane lattice parameter and providing the buffer layer upon the surface layer of the substrate, the buffer layer having a surface that contains peaks and valleys;
   growing an additional layer upon the buffer layer, the additional layer having a third in-plane lattice parameter that corresponds to the lattice parameter value of the additional layer material in a relaxed state; and
   providing the top layer upon the additional layer, the top layer having a lattice parameter that corresponds to the lattice parameter value of the top layer material in a relaxed state,
   wherein the top layer and the additional layer are both in a strained state after being provided upon the additional layer and the buffer layer, respectively, and the third in-plane lattice parameter of the additional layer has a value in between those of the first and second lattice parameters to increase growth speed of the additional layer in the valleys compared to on the peaks of the surface of the buffer layer to thereby improve the surface roughness of the additional layer, and in turn, that of the top layer of the semiconductor heterostructure, wherein the thickness of each of the additional layer and of the top layer is less than the critical thickness above which defects occur.

2. The method of claim 1, wherein the buffer layer is grown on the substrate, and the additional layer, the top layer or each layer is provided by growth at a growth temperature that is lower than that used for the growth of the buffer layer to further reduce surface roughness in the semiconductor heterostructure.

3. The method of claim 2, wherein the growth temperature used for the additional layer or the top layer is chosen to be about 50° C. to about 500° C. lower than the growth temperature used for the buffer layer.

4. The method of claim 1, wherein the thickness of the additional layer or top layer is between about 200 Å and 1000 Å.

5. The method of claim 1, which further comprises fabricating a strained layer on insulator structure for use in preparing a semiconductor device, wherein the semiconductor heterostructure of claim 1 is used as a donor substrate and from which a thin layer is cleaved therefrom and transferred to a received substrate.

6. The method of claim 1, wherein the buffer layer and the additional layer each comprises at least two compounds A and B but have a different composition with respect to each other, wherein the buffer layer has the composition $A_{1-xa2}B_{xa2}$ and the additional layer has the composition $A_{1-xa3}B_{xa3}$.

7. The method of claim 1, wherein the top layer is a strained layer or a relaxed layer.

8. The method of claim 7, wherein the top layer is made of silicon (sSi), germanium (Ge), silicon germanium ($Si_{1-x}Ge_x$), or gallium arsenide (GaAs).

9. The method of claim 8, wherein when silicon is used as the top layer a growth temperature that is less than less than 550° C. to 700° C. is used, or when germanium is used as the top layer, a growth temperature that is less than 500° C. is used.

10. The method of claim 1, wherein the substrate is silicon and the buffer layer is silicon germanium ($Si_{1-xa2}Ge_{xa2}$).

11. The method of claim 1, wherein the additional layer is silicon germanium ($Si_{1-xa3}Ge_{xa3}$) and the top layer is silicon germanium ($Si_{1-x}Ge_x$).

12. The method of claim 11, wherein the silicon germanium top or additional layer has a growth temperature that is based on germanium percentage according to the following table:

| layer material | growth temperature [° C.] |
| --- | --- |
| $Si_{1-x}Ge_x$, x∈[0, 20] | 650-750 |
| $Si_{1-x}Ge_x$, x∈[20, 40] | 600-700 |
| $Si_{1-x}Ge_x$, x∈[40, 60] | 550-650 |
| $Si_{1-x}Ge_x$, x∈[60, 80] | 500-600 |
| $Si_{1-x}Ge_x$, x∈[80, 90] | <600 |
| $Si_{1-x}Ge_x$, x∈[90, 100] | <550. |

13. The method of claim 1 wherein the surface roughness of the top layer is less than 1.8 Å RMS.

14. The method of claim 1 wherein the interface roughness at the interface between the additional layer and the top layer is less than 2.5 Å RMS.

15. The method of claim 1, wherein the substrate is silicon, the buffer layer is silicon germanium ($Si_{1-xa}Ge_{xa2}$), and the top layer is a strained silicon layer.

16. The method of claim 1 wherein the top layer is strained silicon (sSi), silicon germanium (($Si_{1-x}Ge_x$), germanium (Ge) or gallium arsenide (GaAs), and the additional layer is silicon germanium ($Si_{1-xa3}Ge_{xa3}$).

17. A method for reducing surface roughness in a semiconductor heterostructure that includes a substrate, a buffer layer and a top layer, which method comprises:
   providing the substrate with at least a surface layer having a first in-plane lattice parameter;

providing the buffer layer with a second in-plane lattice parameter and providing the buffer layer upon the surface layer of the substrate;

providing an additional layer upon the buffer layer, wherein the buffer layer and the additional layer each comprises at least two compounds A and B but have a different composition with respect to each other, wherein the buffer layer has the composition $A_{1-x_{a2}}B_{x_{a2}}$ and the additional layer has the composition $A_{1-x_{a3}}B_{x_{a3}}$, and wherein the difference in composition of the buffer layer and additional layer $\Delta x = x_{a2} - x_{a3}$ is approximately 0.5% to 8%; and providing the top layer upon the additional layer, wherein the additional layer is strained after being provided upon the buffer layer and has a third in-plane lattice parameter which has a value in between those of the first and second lattice parameters to thereby improve the surface roughness of the additional layer and, in turn, that of the top layer of the semiconductor heterostructure, wherein the thickness of the additional layer or of the top layer is less than the critical thickness above which defects occur;

wherein the recited lattice parameters of both the substrate and the additional and top layers before being provided upon the respective adjacent layer(s) correspond to lattice parameter values in a relaxed state.

18. A method for reducing surface roughness in a semiconductor heterostructure that includes a substrate, a buffer layer and a top layer, which method comprises:

providing the substrate with at least a surface layer having a first in-plane lattice parameter;

providing the buffer layer with a second in-plane lattice parameter and providing the buffer layer upon the surface layer of the substrate;

providing an additional layer upon the buffer layer; and providing the top layer upon the additional layer, wherein the top layer and the additional layer are both in a tensely strained state after being provided upon the additional layer and the buffer layer, respectively, and the additional layer has a third in-plane lattice parameter which has a value in between those of the first and second lattice parameters to thereby improve the surface roughness of the additional layer and, in turn, that of the top layer of the semiconductor heterostructure, wherein the thickness of each of the additional layer and of the top layer is less than the critical thickness above which defects occur;

wherein the recited lattice parameters of both the substrate and the additional and top layers before being provided upon the respective adjacent layer(s) correspond to lattice parameter values of materials in a relaxed state.

* * * * *

UNITED STATES PATENT AND TRADEMARK OFFICE
CERTIFICATE OF CORRECTION

PATENT NO.        : 7,772,127 B2                                           Page 1 of 1
APPLICATION NO.   : 11/267494
DATED             : August 10, 2010
INVENTOR(S)       : Figuet et al.

It is certified that error appears in the above-identified patent and that said Letters Patent is hereby corrected as shown below:

Column 12:
Line 56 (claim 15, line 2), change "$(Si_{l-xa}Ge_{xa2})$" to -- $(Si_{l-xa2}Ge_{xa2})$ --.

Column 14:
Line 11 (claim 18, line 11), change "tensely" to -- tensilely --.

Signed and Sealed this

Fourteenth Day of September, 2010

David J. Kappos
*Director of the United States Patent and Trademark Office*